United States Patent
Guo

(10) Patent No.: US 9,263,410 B2
(45) Date of Patent: Feb. 16, 2016

(54) CHIP DETECTING SYSTEM AND DETECTING METHOD

(71) Applicant: Huawei Technologies Co., Ltd., Shenzhen (CN)

(72) Inventor: Jianqiang Guo, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/559,050

(22) Filed: Dec. 3, 2014

(65) Prior Publication Data

US 2015/0155213 A1 Jun. 4, 2015

(30) Foreign Application Priority Data

Dec. 3, 2013 (CN) .......................... 2013 1 0643144

(51) Int. Cl.
| | | |
|---|---|---|
| *H01L 21/66* | (2006.01) | |
| *H01L 23/00* | (2006.01) | |
| *H05K 1/02* | (2006.01) | |
| *H05K 3/34* | (2006.01) | |

(52) U.S. Cl.
CPC .............. *H01L 24/14* (2013.01); *H05K 1/0268* (2013.01); *H01L 22/34* (2013.01); *H01L 2924/15311* (2013.01); *H01L 2924/3512* (2013.01); *H05K 3/3436* (2013.01)

(58) Field of Classification Search
CPC ......... H01L 22/14; H01L 22/32; H01L 24/14; H01L 2224/14515
USPC ............................................ 257/48, 737, 738
See application file for complete search history.

(56) References Cited

U.S. PATENT DOCUMENTS

| 6,081,429 | A | * | 6/2000 | Barrett | ........................ | 361/767 |
| 6,452,807 | B1 | * | 9/2002 | Barrett | ........................ | 361/767 |
| 7,928,591 | B2 | * | 4/2011 | Chen | ........................... | 257/797 |
| 8,822,238 | B2 | * | 9/2014 | Chen | ............................... | 438/5 |
| 8,829,918 | B2 | * | 9/2014 | Sylvester et al. | ............. | 324/538 |

(Continued)

FOREIGN PATENT DOCUMENTS

| CN | 101226224 A | 7/2008 |
| CN | 102414806 A | 4/2012 |
| JP | 2001337129 A | 12/2001 |

OTHER PUBLICATIONS

Foreign Communication From A Counterpart Application, Chinese Application No. 201310643144.4, Chinese Search Report dated Dec. 3, 2013, 2 pages.

(Continued)

*Primary Examiner* — Allan R Wilson
(74) *Attorney, Agent, or Firm* — Conley Rose, P.C.; Grant Rodolph; Adam J. Stegge

(57) ABSTRACT

A chip detecting system is disclosed. The system includes a ball grid array (BGA) chip and a circuit board, the BGA chip includes at least two functional pins being located at a corner of the BGA chip, the at least two functional pins are electrically connected to each other, the circuit board is provided with at least two solder pads and at least two testing pads, the at least two functional pins are electrically connected to the at least two solder pads by using solder balls separately, the solder pads are electrically connected to the testing pads separately, and the at least two testing pads are configured to electrically connect to a detector, so as to detect whether a crack exists between the at least two functional pins and the circuit board.

4 Claims, 3 Drawing Sheets

(56) References Cited

U.S. PATENT DOCUMENTS

| | | |
|---|---|---|
| 2006/0131744 A1 | 6/2006 | O'Connor et al. |
| 2006/0202359 A1* | 9/2006 | Chen .............................. 257/797 |
| 2012/0001642 A1* | 1/2012 | Sylvester et al. ............. 324/538 |
| 2012/0112540 A1* | 5/2012 | Takeda et al. ................... 307/18 |
| 2012/0176149 A1* | 7/2012 | Yamayose et al. ......... 324/750.3 |
| 2013/0292817 A1* | 11/2013 | LaCroix et al. ............... 257/737 |

OTHER PUBLICATIONS

Foreign Communication From A Counterpart Application, Chinese Application No. 201310643144.4, Chinese Office Action dated Nov. 16, 2015, 4 pages.

* cited by examiner

CHIP DETECTING SYSTEM AND DETECTING METHOD

CROSS-REFERENCE TO RELATED APPLICATIONS

This application claims priority to Chinese Patent Application No. 201310643144.4, filed on Dec. 3, 2013, which is hereby incorporated by reference in its entirety.

TECHNICAL FIELD

The present invention relates to the field of chip detecting technologies, and in particular, to a chip detecting system and detecting method aiming at a problem that stress causes damage to a ball grid array (BGA) packaging device.

BACKGROUND

Damage caused by stress to a BGA packaging device of a chip generally occurs at a corner of a BGA, and the BGA is generally square or rectangular, so that areas at four corners of these shapes or areas near the corners are first subject to stress-caused damage, resulting in a problem of a stress-caused crack. In the prior art, a manner of detecting a crack, due to stress, of a chip is to perform analysis and detection by using a nondestructive time domain reflectometry (TDR) technology, and in the TDR technology, a professional TDR analyzing device is required, costs are high, and professional TDR analysis skilled personnel are also required. Another detection manner in the prior art is destructive analysis, where whether a chip has a crack is determined by dyeing and prying or slicing, and by using the detection method, a professional skill of dyeing and prying or slicing is required, and a sample after the detection has to be scrapped.

SUMMARY

A technical effect mainly achieved by the present invention is to provide a chip detecting system and detecting method, which are low in cost and can implement fast detection without a dedicated detecting device or a professional skill, and the detection is non-destructive.

In order to achieve the foregoing objective, embodiments of the present invention provide the following technical solutions.

According to one aspect, the present invention provides a chip detecting system, where the chip detecting system includes a BGA chip and a circuit board, the BGA chip includes at least two functional pins, the at least two functional pins are located at a corner of the BGA chip, the at least two functional pins are electrically connected to each other, the circuit board is provided with at least two solder pads and at least two testing pads, the at least two functional pins are electrically connected to the at least two solder pads by using solder balls separately, the at least two solder pads are electrically connected to the testing pads separately, and the at least two testing pads are configured to electrically connect to a detector, so as to detect whether a crack exists between the at least two functional pins and the circuit board.

The at least two functional pins include two idle pins with an attribute of idleness, two of the testing pads are electrically connected to the two idle pins, and a value of resistance between the two of the testing pads is measured by using the detector, so as to detect whether a crack exists between the at least two idle pins and the circuit board.

The at least two functional pins are idle pins with an attribute of idleness, the circuit board further includes a power supply solder pad, the power supply solder pad and the at least two testing pads are serially-connected to form a serially-connected circuit, and an open or normal state of the serially-connected circuit is measured by using the detector, so as to detect whether a crack exists between the at least two functional pins and the circuit board.

The at least two functional pins are power supply pins with an attribute of a power supply, the BGA chip further includes a ground pin, the circuit board further includes a grounding solder pad and a power supply layer, the grounding solder pad and the ground pin are electrically connected, the at least two solder pads are both electrically connected to the power supply layer, a short circuiter is disposed between each of the solder pads and the power supply layer, and an open or normal state between the grounding solder pad and each of the testing pads is measured by using the detector, so as to detect whether a crack exists between the at least two functional pins and the circuit board.

The at least two functional pins are ground pins with an attribute of a ground, the BGA chip further includes a power supply pin, the circuit board further includes a power supply solder pad and a grounding layer, the power supply solder pad and the power supply pin are electrically connected, the at least two solder pads are both electrically connected to the grounding layer, a short circuiter is disposed between each of the solder pads and the grounding layer, and an open or normal state between the power supply solder pad and one of the testing pads is measured by using the detector, so as to detect whether a crack exists between the at least two functional pins and the circuit board.

The present invention further provides a chip detecting system, where the chip detecting system includes a BGA chip and a circuit board, the BGA chip includes at least two monitoring signal output pins, the at least two monitoring signal output pins are located at a corner of the BGA chip, the at least two monitoring signal output pins are electrically connected to each other, the circuit board is provided with at least two solder pads, the at least two monitoring signal output pins are electrically connected to the at least two solder pads by using solder balls separately, the at least two solder pads are electrically connected to each other, the BGA chip further includes monitoring signal input pins, the monitoring signal input pins, the monitoring signal output pins, and the solder pads on the circuit board jointly form a monitoring signal input and output closed loop, and whether a crack exists between the at least two monitoring signal output pins and the circuit board is determined according to open or normal of the monitoring signal.

The circuit board includes a plurality of via holes, and electrical connection between the at least two solder pads and the monitoring signal input pins is implemented by using the via holes and wiring of the circuit board.

According to another aspect, the present invention provides a detecting method, used to detect whether a crack exists between a BGA chip and a circuit board, where the detecting method includes disposing at least two functional pins at a corner of the BGA chip, and electrically connecting the at least two functional pins to each other; disposing at least two solder pads and at least two testing pads on the circuit board, where the at least two solder pads are electrically connected to the at least two testing pads separately; mounting the BGA chip on the circuit board, so as to electrically connect the at least two functional pins to the solder pads by using solder balls; and electrically connecting to the at least two testing pads by using a detector, so as to detect whether a crack exists between the at least two functional pins and the circuit board.

The detecting method further includes setting the at least two functional pins as idle pins with an attribute of idleness, and measuring a value of resistance between two of the testing pads by using the detector, so as to detect whether a crack exists between the at least two idle pins and the circuit board.

The detecting method further includes setting the at least two functional pins as idle pins with an attribute of idleness, disposing a power supply solder pad on the circuit board, and serially connecting the power supply solder pad and the at least two testing pads to form a serially-connected circuit, and measuring an open or normal state of the serially-connected circuit by using the detector, so as to detect whether a crack exists between the at least two functional pins and the circuit board.

The detecting method further includes setting the at least two functional pins as power supply pins with an attribute of a power supply, disposing a ground pin on the BGA chip, disposing a grounding solder pad and a power supply layer on the circuit board, and in a process of mounting the BGA chip on the circuit board, electrically connecting the grounding solder pad and the ground pin and electrically connecting the at least two solder pads to the power supply layer, disposing a short circuiter between each of the solder pads and the power supply layer, and measuring an open or normal state between the grounding solder pad and one of the testing pads by using the detector, so as to detect whether a crack exists between the at least two functional pins and the circuit board.

The detecting method further includes setting the at least two functional pins as ground pins with an attribute of a ground, disposing a power supply pin on the BGA chip, disposing a power supply solder pad and a grounding layer on the circuit board, and in a process of mounting the BGA chip on the circuit board, electrically connecting the power supply solder pad and the power supply pin and electrically connecting both of the at least two solder pads to the grounding layer, disposing a short circuiter between each of the solder pads and the power supply layer, and measuring an open or normal state between the power supply solder pad and one of the testing pads by using the detector, so as to detect whether a crack exists between the at least two functional pins and the circuit board.

The present invention further provides a detecting method, used to detect whether a crack exists between a BGA chip and a circuit board, where the detecting method includes disposing at least two monitoring signal output pins and monitoring signal input pins at a corner of the BGA chip, and electrically connecting the at least two monitoring signal output pins to each other; disposing at least two solder pads on the circuit board; mounting the BGA chip on the circuit board, so that the monitoring signal input pins, the monitoring signal output pins, and the solder pads on the circuit board jointly form a monitoring signal input and output closed loop; and determining whether a crack exists between the at least two monitoring signal output pins and the circuit board according to open or normal of the monitoring signal.

The circuit board further includes disposing a via hole on the circuit board, and implementing electrical connection between the at least two solder pads and the monitoring signal input pins by using the via hole and wiring of the circuit board.

According to the chip detecting system and the chip detecting method that are provided in the present invention, functional pins are disposed on a BGA chip, testing pads are disposed on a circuit board, and testing pads are configured to electrically connect to a detector, so as to detect whether a crack exists between the at least two functional pins and the circuit board. Therefore, whether an open circuit caused by a stress impact at a corresponding corner of a chip can be detected fast without a dedicated detecting device or a professional skill, and the detection is non-destructive.

BRIEF DESCRIPTION OF THE DRAWINGS

To describe the technical solutions in the present invention more clearly, the following briefly introduces the accompanying drawings required for describing the embodiments. The accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention.

Figure 1:
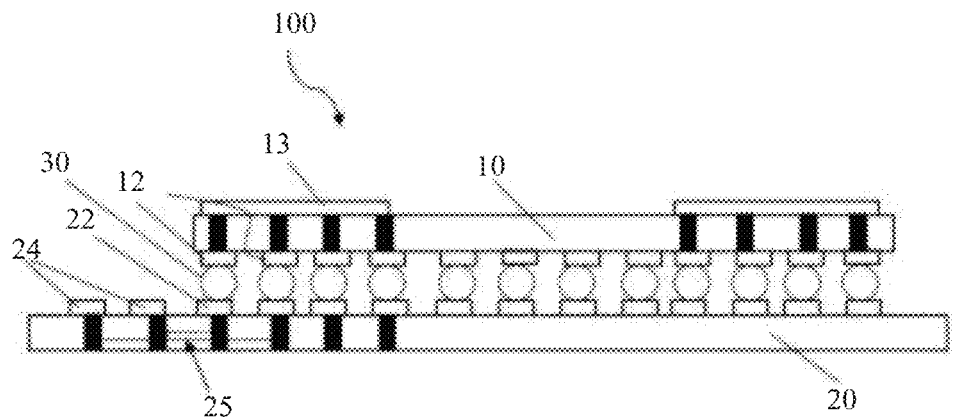
FIG. 1 is a schematic diagram of a chip detecting system according to an implementation manner of the present invention.

Referring to FIG. 1, the present invention provides a chip detecting system 100 configured to detect whether a BGA chip has a crack caused by stress. Whether an open circuit caused by an application impact at a corresponding corner of a chip can be detected fast without a dedicated detecting device or a professional skill, and the detection is non-destructive, that is, a BGA chip is not damaged in the detection process.

In an implementation manner, the chip detecting system 100 includes a BGA chip 10 and a circuit board 20, where the BGA chip 10 includes at least two functional pins 12, the at least two functional pins 12 are located at a corner of the BGA chip 10, the at least two functional pins 12 are electrically connected to each other, and in the implementation manner, the functional pins 12 are electrically connected to each other by using a copper piece 13. The circuit board 20 is provided with at least two solder pads 22 and at least two testing pads 24, the at least two functional pins 12 are electrically connected to the at least two solder pads 22 by using solder balls 30 separately, the solder pads 22 are electrically connected to the testing pads 24 separately, and in the implementation manner, the solder pads 22 are electrically connected to the testing pads 24 by using a circuit board lead 25. The at least two testing pads 24 are configured to electrically connect to a detector (not shown in the figure), so as to detect whether a crack exists between the at least two functional pins 12 and the circuit board 20. The detector may be a multimeter or another simple and portable detection apparatus. The at least two functional pins 12 are in a one-to-one correspondence with the at least two solder pads 22 and the at least two testing pads 24.

During designing of the BGA chip 10, an attribute of the at least two functional pins 12 is first designed, where the at least two functional pins 12 are dedicated to detection of a stress-caused crack of the BGA chip 10, and even if these functional pins 12 are open-circuited or short-circuited, normal operation of the BGA chip 10 is not affected. In the implementation manner, a corner of the BGA chip 10 is detected, and functional pins 12 at a corner belong to a same signal (for example, power supply signal pins, ground signal pins, or idle pins). Certainly, a plurality of corners may also be detected, and as long as it is ensured that functional pins 12 at each corner belong to a same signal, functional pins 12 at different corners may belong to different signals, for example, functional pins 12 at one of the corners belong to a ground signal, and functional pins 12 at another corner belong to a power supply signal.

Figure 2:
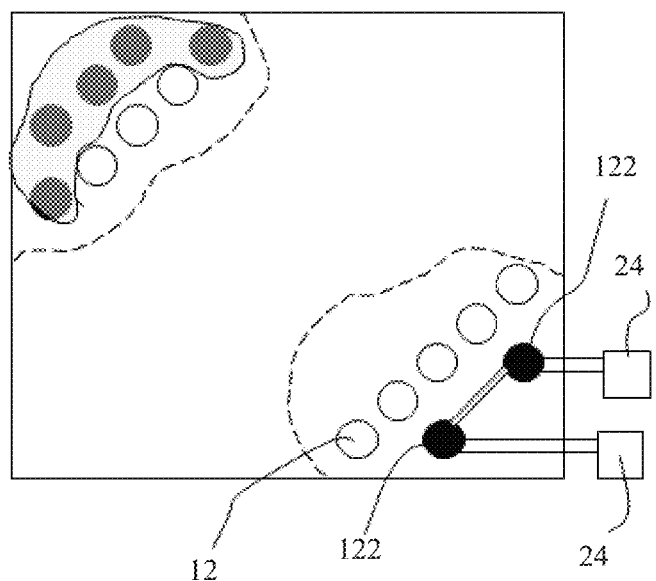
FIG. 2 is a schematic diagram of a connection relationship between a chip and a circuit board when a functional pin in a chip detecting system is an idle pin according to the present invention.

In an implementation manner, referring to FIG. 2, the at least two functional pins 12 include two idle pins 122 with an attribute of idleness, two of the testing pads 24 are electrically connected to the two idle pins 122, and a value of resistance between the two of the testing pads 24 is measured by using the detector, so as to detect whether a crack exists between the at least two idle pins 122 and the circuit board 20. In the implementation manner, a multimeter is used to connect to the two of the testing pads 24, so as to determine whether an open-circuit situation exists, and if there is a plurality of functional pins 12 and a plurality of testing pads 24, multiple tests are performed by using each two testing pads 24 as one set, which can measure which two functional pins 12 have a crack phenomenon.

Figure 3:
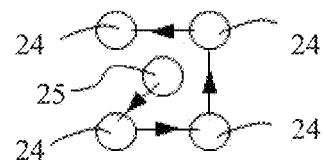
FIG. 3 is a schematic diagram of a connection relationship between a testing pad and a power supply solder pad that are on a circuit board in a chip detecting system according to an implementation manner of the present invention.

In another implementation manner, the at least two functional pins 12 are idle pins 122 with an attribute of idleness, the circuit board 20 further includes a power supply solder pad 25, and the power supply solder pad 25 and the at least two testing pads 24 are serially-connected to form a serially-connected circuit. As shown in FIG. 3, an open or normal state of the serially-connected circuit is measured by using the detector, so as to detect whether a crack exists between the at least two functional pins 12 and the circuit board 20. In the implementation manner, a multimeter is used to measure a serially-connected circuit, which can measure whether a crack phenomenon exists on the BGA chip 10 at a first attempt without multiple times of measurement, but cannot measure which functional pin 12 has a crack.

Figure 4:
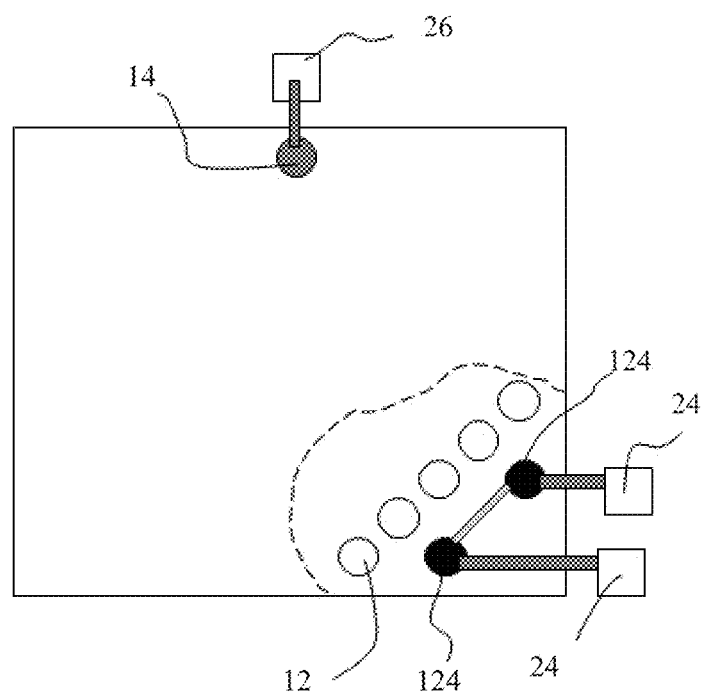
FIG. 4 is a schematic diagram of a connection relationship between a chip and a circuit board when a functional pin in a chip detecting system is a power supply pin according to the present invention.

Referring to FIG. 4, in yet another implementation manner, the at least two functional pins 12 are power supply pins 124 with an attribute of a power supply, the BGA chip 10 further includes a ground pin 14, the circuit board 20 further includes a grounding solder pad 26 and a power supply layer, the grounding solder pad 26 and the ground pin 14 are electrically connected, the at least two solder pads 22 are both electrically connected to the power supply layer, a short circuiter is disposed between each of the solder pads 22 and the power supply layer, and an open or normal state between the grounding solder pad 26 and one of the testing pads 24 is measured by using the detector, so as to detect whether a crack exists between the at least two functional pins 12 and the circuit board 20. In the implementation manner, the functional pins 12 are designed as the power supply pins 124, a path is formed between the power supply pins 124 and the ground pin 14, and a multimeter is used to detect an open or normal state of the path.

Figure 5:
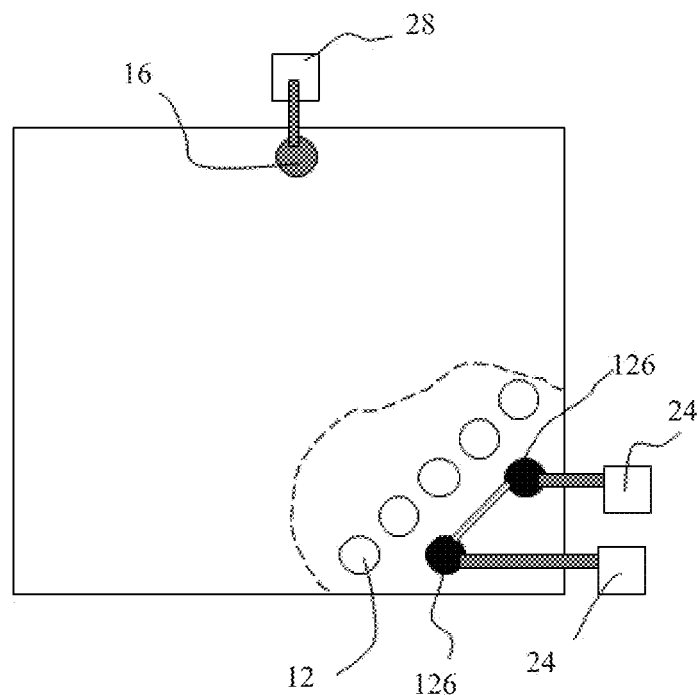
FIG. 5 is a schematic diagram of a connection relationship between a chip and a circuit board when a functional pin in a chip detecting system is a grounding pin according to the present invention.

Referring to FIG. 5, in yet another implementation manner, the at least two functional pins 12 are grounding pins 126 with an attribute of a ground, the BGA chip 10 further includes a power supply pin 16, the circuit board 20 further includes a power supply solder pad 28 and a grounding layer, the power supply solder pad 28 and the power supply pin 16 are electrically connected, the at least two solder pads 22 are both electrically connected to the grounding layer, a short circuiter is disposed between each of the solder pads 22 and the grounding layer, and an open or normal state between the power supply solder pad 28 and one of the testing pads 24 is measured by using the detector, so as to detect whether a crack exists between the at least two functional pins 12 and the circuit board 20. In the implementation manner, the functional pins 12 are designed as the grounding pins 126, a path is formed between the power supply pin 16 and the grounding pins 126, and a multimeter is used to detect an open or normal state of the path.

Figure 6:
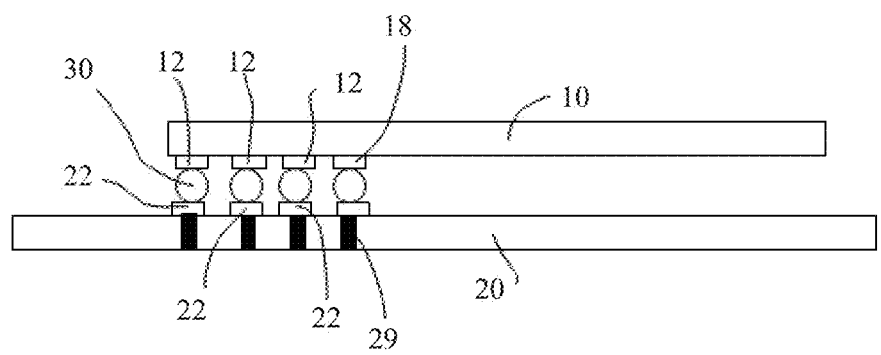
FIG. 6 is a schematic diagram of a chip detecting system determining whether a chip has a crack by forming a loop between a monitoring signal output pin and a monitoring signal input pin according to the present invention.

Referring to FIG. 6, the present invention further provides a chip detecting system 100, where a loop is formed between a monitoring signal output pin and a monitoring signal input pin, and whether a BGA chip 10 has a crack is determined by using open or normal of the loop. A specific solution is as follows: the chip detecting system 100 includes the BGA chip 10 and a circuit board 20, the BGA chip 10 includes at least two monitoring signal output pins 12, the at least two monitoring signal output pins 12 are located at a corner of the BGA chip 10, the at least two monitoring signal output pins 12 are electrically connected to each other, the circuit board 20 is provided with at least two solder pads 22, the at least two monitoring signal output pins 12 are electrically connected to the at least two solder pads 22 by using solder balls 30 separately, the at least two solder pads 22 are electrically connected to each other, the BGA chip 10 further includes monitoring signal input pins 18, the monitoring signal input pins 18, the monitoring signal output pins 12, and the solder pads 22 on the circuit board 20 jointly form a monitoring signal input and output closed loop, and whether a crack exists between the at least two monitoring signal output pins 12 and the circuit board 20 is determined according to open or normal of the monitoring signal. The circuit board 20 includes a plurality of via holes 29, and electrical connection between the at least two solder pads 22 and the monitoring signal input pins 18 is implemented by using the via holes 29 and wiring of the circuit board 20.

According to another aspect, the present invention provides a detecting method, used to detect whether a crack exists between a BGA chip 10 and a circuit board 20, where the detecting method includes disposing at least two functional pins 12 at a corner of the BGA chip 10, and electrically connecting the at least two functional pins 12 to each other; disposing at least two solder pads 22 and at least two testing pads 24 on the circuit board 20, where the solder pads 22 are electrically connected to the testing pads 24 separately; mounting the BGA chip 10 on the circuit board 20, so as to electrically connect the at least two functional pins 12 to the solder pads 22 by using solder balls 30; and electrically connecting to the at least two testing pads 24 by using a detector, so as to detect whether a crack exists between the at least two functional pins 12 and the circuit board 20.

In an implementation manner, the detecting method further includes setting the at least two functional pins 12 as idle pins 122 with an attribute of idleness, and measuring a value of resistance between two of the testing pads 24 by using the detector, so as to detect whether a crack exists between the at least two idle pins 122 and the circuit board 20.

In another implementation manner, the detecting method further includes setting the at least two functional pins 12 as idle pins 122 with an attribute of idleness, disposing a power supply solder pad 22 on the circuit board 20, serially connecting the power supply solder pad 22 and the at least two testing pads 24 to form a serially-connected circuit, and measuring an open or normal state of the serially-connected circuit by using the detector, so as to detect whether a crack exists between the at least two functional pins 12 and the circuit board 20.

In yet another implementation manner, the detecting method further includes setting the at least two functional pins 12 as power supply pins 124 with an attribute of a power supply, disposing a ground pin 14 on the BGA chip 10, disposing a grounding solder pad 26 and a power supply layer on the circuit board 20, and in a process of mounting the BGA chip 10 on the circuit board 20, electrically connecting the grounding solder pad 26 and the ground pin 14 and electrically connecting the at least two solder pads 22 to the power supply layer, disposing a short circuiter between each of the solder pads 22 and the power supply layer, and measuring an open or normal state between the grounding solder pad 26 and one of the testing pads 24 by using the detector, so as to detect whether a crack exists between the at least two functional pins 12 and the circuit board 20.

In yet another implementation manner, the detecting method further includes setting the at least two functional pins 12 as ground pins 14 with an attribute of a ground, disposing a power supply pin 124 on the BGA chip 10, disposing a power supply solder pad 22 and a grounding layer on the circuit board 20, and in a process of mounting the BGA chip 10 on the circuit board 20, electrically connecting the power supply solder pad 22 and the power supply pin 124 and electrically connecting both of the at least two solder pads 22 to the grounding layer, disposing a short circuiter between each of the solder pads 22 and the power supply layer, and measuring an open or normal state between the power supply solder pad 22 and one of the testing pads 24 by using the detector, so as to detect whether a crack exists between the at least two functional pins 12 and the circuit board 20.

The present invention further provides a detecting method, used to detect whether a crack exists between a BGA chip 10 and a circuit board 20, where the detecting method includes disposing at least two monitoring signal output pins and monitoring signal input pins at a corner of the BGA chip 10, and electrically connecting the at least two monitoring signal output pins to each other; disposing at least two solder pads 22 on the circuit board 20; mounting the BGA chip 10 on the circuit board 20, so that the monitoring signal input pins, the monitoring signal output pins, and the solder pads 22 on the circuit board 20 jointly form a monitoring signal input and output closed loop; and determining whether a crack exists between the at least two functional pins 12 and the circuit board 20 according to open or normal of the monitoring signal.

The detecting method further includes disposing a via hole on the circuit board 20, and implementing electrical connection between the at least two solder pads 22 and the monitoring signal input pins by using the via hole and wiring of the circuit board 20.

According to the chip detecting system 100 and the chip detecting method that are provided in the present invention, functional pins 12 are disposed on a BGA chip 10, testing pads 24 are disposed on a circuit board 20, and the testing pads 24 are configured to electrically connect to a detector, so as to detect whether a crack exists between the at least two functional pins 12 and the circuit board 20. Therefore, whether an open circuit caused by an application impact at a corresponding corner of a chip can be detected fast without a dedicated detecting device or a professional skill, and the detection is non-destructive.

The foregoing descriptions are exemplary implementation manners of the present invention. It should be noted that a person of ordinary skill in the art may make improvements and polishing without departing from the principle of the present invention, and the improvements and polishing shall fall within the protection scope of the present invention.

What is claimed is:

1. A chip detecting system, comprising:
   a ball grid array (BGA) chip comprising at least two monitoring signal output pins located at a corner of the BGA chip, wherein the at least two monitoring signal output pins are electrically connected to each other; and
   a circuit board comprising at least two solder pads electrically connected to each other,
   wherein the at least two monitoring signal output pins are electrically connected to the at least two solder pads using solder balls separately,
   wherein the BGA chip further comprises monitoring signal input pins,
   wherein the monitoring signal input pins, the monitoring signal output pins, and the solder pads on the circuit board jointly form a monitoring signal input and output closed loop, and
   wherein whether a crack exists between the at least two monitoring signal output pins and the circuit board is determined according to open or normal of a monitoring signal.

2. The chip detecting system according to claim 1, wherein the circuit board comprises a plurality of via holes, and wherein electrical connection between the at least two solder pads and the monitoring signal input pins is implemented using the via holes and wiring of the circuit board.

3. A detecting method used to detect whether a crack exists between a ball grid array (BGA) chip and a circuit board, wherein the detecting method comprises:
   disposing at least two monitoring signal output pins;
   monitoring signal input pins at a corner of the BGA chip;
   electrically connecting the at least two monitoring signal output pins to each other;
   disposing at least two solder pads on the circuit board;
   mounting the BGA chip on the circuit board such that the monitoring signal input pins, the monitoring signal output pins, and the solder pads on the circuit board jointly form a monitoring signal input and output closed loop; and
   determining whether a crack exists between the at least two monitoring signal output pins and the circuit board according to open or normal of a monitoring signal.

4. The detecting method according to claim 3, further comprising:
   disposing a via hole on the circuit board; and
   implementing electrical connection between the at least two solder pads and the monitoring signal input pins using the via hole and wiring of the circuit board.

* * * * *

UNITED STATES PATENT AND TRADEMARK OFFICE
CERTIFICATE OF CORRECTION

PATENT NO.         : 9,263,410 B2
APPLICATION NO.    : 14/559050
DATED              : February 16, 2016
INVENTOR(S)        : Jianqiang Guo It is certified that error appears in the above-identified patent and that said Letters Patent is hereby corrected as shown below:

On The Title Page,

Item (30), Foreign Application priority Data section should read:

Dec. 3, 2013    (CN) ........................201310643144.4

Item (56), References Cited, Other Publications section should read:

Foreign Communication From A Counterpart Application, Chinese Application No. 201310643144.4, Chinese Search Report dated Nov. 5, 2015, 2 pages.

Signed and Sealed this
Fifth Day of July, 2016

Michelle K. Lee
*Director of the United States Patent and Trademark Office*